United States Patent [19]

Nakano et al.

[11] Patent Number: 4,578,526
[45] Date of Patent: Mar. 25, 1986

[54] SOLAR MODULE

[75] Inventors: Akihiko Nakano, Itami; Hitoshi Matsumoto, Osaka; Hiroshi Uda, Ikoma; Yasumasa Komatsu, Sakai; Kiyoshi Kuribayashi, Hirakata; Seiji Ikegami, Osaka, all of Japan

[73] Assignee: Matsushita Electric Industrial Co., Ltd., Osaka, Japan

[21] Appl. No.: 636,245

[22] Filed: Jul. 31, 1984

[30] Foreign Application Priority Data

Aug. 1, 1983 [JP] Japan .................. 58-141333

[51] Int. Cl.$^4$ ............................. H01L 27/14
[52] U.S. Cl. .................... 136/251; 136/260
[58] Field of Search .......... 136/251, 259, 260

[56] References Cited

U.S. PATENT DOCUMENTS 4,401,839  8/1983  Pyle ........................ 136/251

FOREIGN PATENT DOCUMENTS

| 55-123178 | 9/1980 | Japan | 136/251 |
| 57-13776 | 1/1982 | Japan | 136/260 |
| 57-63866 | 4/1982 | Japan | 136/251 |
| 58-18971 | 2/1983 | Japan | 136/260 |
| 58-50782 | 3/1983 | Japan | 136/251 |

OTHER PUBLICATIONS

W. Carroll et al., Conf. Record, 12th IEEE Photovoltaic Specialists Conf. (1976), pp. 332-339.
D. C. Carmichael et al., Conf. Record, 12th IEEE Photovoltaic Specialists Conf. (1976), pp. 317-331.
Uda et al., Proceeding of the Sixteenth IEEE Photovoltaic Specialists Conference, pp. 801-804, Sep. 1982.
Television-Gakukaishi, vol. 35, No. 10, pp. 810-818 (1981).

Primary Examiner—Aaron Weisstuch
Attorney, Agent, or Firm—Wenderoth, Lind & Ponack

[57] ABSTRACT

A reliable and inexpensive solar module is disclosed. The solar module comprises a thin-film type photovoltaic cell array formed on a glass superstrate, leaving a margin of an appropriate width along the periphery of the glass superstrate, and a resin layer coated on the photovoltaic cell array and the peripheral margin of the glass superstrate. The solar module further comprises a backcover adhered by the resin layer to cover the photovoltaic cell array and the peripheral margin of the glass superstrate. The resin layer is preferably made of a fluoropolymer derived from a compound containing a perfluoroalkylene and active hydrogen atoms.

4 Claims, 4 Drawing Figures

SOLAR MODULE

BACKGROUND OF THE INVENTION

1. Field of the Invention

This invention relates to a solar module, and more particularly to a construction of a solar module and a material used as a coating or adhesive material.

2. Description of the Prior Art

Most of the conventional solar modules comprise crystalline-type cells such as single crystal silicon cells and polycrystal silicon cells. A comprehensive discussion of available encapsulation techniques and data for silicon flat-plate solar modules is presented, for example, in "Photovoltaic-Module Encapsulation Design and Materials Selection: Volume 1" by E. Cuddihy, W. Carroll, C. Coulbert, A. Gupta and R. Liang, by Jet Propulsion Laboratory (JPL) (June 1, 1982). A few of the techniques are applicable to modules comprising thin film-type solar cells but most are not. Therefore, it has been desired to develop a new technique for modules comprising thin film-type solar cells.

In the conventional module comprising crystalline-type solar cells, photovoltaic parts and connections thereof are buried or sandwiched in pottants made of such materials as ethylene vinyl acetate (EVA), ethylene methyl acrylate (EMA), acrylic laminating film, poly-n-butyl acrylate (InBA), aliphatic polyester urethane, silicone elastomer, and polyvinyl butyral (PVB). The pottants must be transparent, chemically stable, processible, elastomeric, and commercially available. The pottants must have electrical insulation and inherent weatherability (retention of transparency and mechanical integrity). However, the above listed pottants are not integral, and they often surrender to oxidation and hydrolysis.

In the structure of a module where crystalline-type cells are buried in a pottant or sandwiched between two sheets of a transparent thermoplastic, the layer of plastics is thick, resulting in an extensive, easy oxidation and hydrolysis of plastics and buried or sandwiched parts when the layer is directly exposed to oxygen and water (or water vapor).

In the case of the thin-film type cells, the photovoltaic elements are formed on a substrate of a small area, usually less than 100 $cm^2$, because it is technically difficult to form a thin film of a large area. Such cells are coated with a resin, for example, epoxy or acrylic resin and used as a small power source for devices such as a wrist watch, a game machine, and a hand calculator. When used as a large power source, the thin-film type cells are connected in series or parallel and then buried or sandwiched between plastic sheets in the same way as the crystalline type cells as described above. Kinds of resins that have been used as pottants, adhesives, or coating materials are: EVA, EMA, acrylics, aliphatic polyester urethane, silicon elastomer, PVB, epoxys, etc.

FIG. 1 is a principal cross-sectional view of a conventional solar module. Solar cells 1 are connected by lead wires 2 and then buried in a transparent pottant 3. The potted solar cells are sandwiched between an upper reinforced glass 4 and a lower protecting backcover. The solar cells 1 are made of sliced wafers of a single-crystal silicon, and therefore are thick. Lead wires 2 each connecting an upper side of a cell with a lower side of another cell are also bulky. Consequently, the thickness of the transparent pottant burying solar cells 1 and lead wires 2 cannot be thin but is considerably thick. At an early stage, the transparent pottant was made of a thermosetting silicone resin. But recently, a thermoplastic such as PVB and EVA has been used. Regardless of the kind of pottant, the thickness of the pottant is considerably large. Due to the large thickness and lack of ability to prevent permeation of water, water permeates into the solar module and degrades the solar cells.

As described above, the conventional construction of solar modules is expensive and heavy. Therefore, it has been desired to develop a new construction of solar module which is simple in construction, light in weight and inexpensive, but stable in performance.

SUMMARY OF THE INVENTION

An object of the present invention is to provide an inexpensive, reliable, simple, and lightweight solar module.

This object can be accomplished by a solar module comprising: a solar cell array comprised of plural solar cells formed on a glass superstrate with a margin of a specified width remaining along the periphery of the substrate; and a resin layer coated to cover the solar cell array and the peripheral margin on the substrate. The solar module may further comprises a backcover provided on the resin layer for protecting the solar cell array, where the resin layer is used as an adhesive to adhere the backcover.

The solar cells are thin-film type photovoltaic cells such as CdS/CdTe type photovoltaic cells. It is preferable to use as the resin layer material a fluoropolymer derived from a compound containing a perfluoroalkylene group and active hydrogen atoms.

By use of the construction in which a margin along the periphery of the glass superstrate is provided and coated with the resin layer, the solar cells are completely isolated from the surroundings so as to be protected from water or water vapor.

The above and other objects, features and advantages of the present invention will become apparent from the following description taken together with the accompanying drawings in which:

DESCRIPTION OF THE PREFERRED EMBODIMENTS

Figure 1:
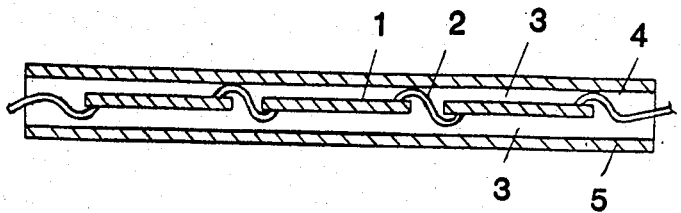
FIG. 1 is a schematic cross-sectional view showing a construction of a conventional solar module.
Figure 2:
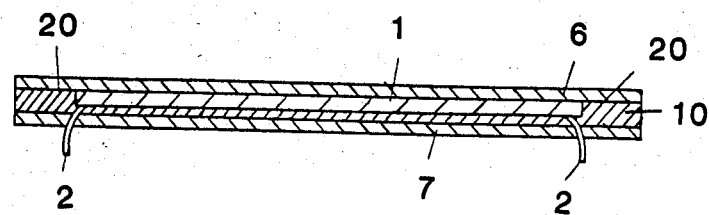
FIG. 2 is a schematic cross-sectional view showing an embodiment of a solar module according to the present invention.
Figure 3:
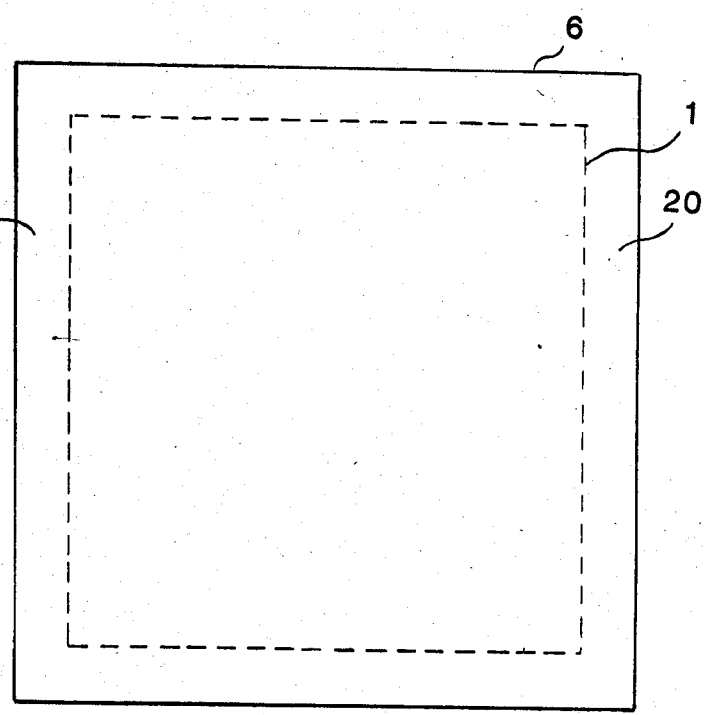
FIG. 3 is a schematic plan view of the embodiment of FIG. 2.

FIG. 2 is a schematic cross-sectional view showing an embodiment of a solar module of the invention, and FIG. 3 is a schematic plan view of the embodiment of FIG. 2.

Referring to FIGS. 2 and 3, a solar cell array 1 which comprises plural photovoltaic (solar) cells is directly formed on a glass superstrate 6 except a peripheral margin 20 along the periphery of the glass superstrate 6. A backcover 7 is adhered to the back surfaces of the solar cell array 1 with a resin layer 10 thereby to cover the solar cell array 1 and the peripheral margin 20 of the glass superstrate 6. The solar cell array 1 is shown in a very simplified illustration, but actually comprises plural solar cells connected in series or parallel. Reference numeral 2 shows lead wires for taking out power.

For example, each of the solar cells is produced as follows: First, a CdS layer is formed on a surface of a borosilicate glass superstrate (the glass substrate 6) which does not contain alkali. In this step, a portion along the periphery of the surface of the glass superstrate 6 (the peripheral margin 20) is remained uniform with the CdS layer. The area of the surface of the glass superstrate 6 is, for example, 900 cm$^2$. Next, a CdTe layer is formed on a part of the CdS layer, and a C layer is formed on the CdTe layer. Then, an Ag layer is formed on the C layer to be a positive electrode, and an Ag-In electrode is formed on the remaining part of the CdS layer. By these steps, a CdS/CdTe type solar cell is formed. A more detailed description of the solar cell array 1 is shown, for example, in Japanese unexamined laid-open patent application Nos. 57-13776 and 58-18971, or "Conference Record, 16th IEEE Photovoltaic Specialists Conference, 1982 (IEEE, New York, 1982)" p. 801, by H. Uda et al.

The solar cell array 1 must be a thin-film type solar cell array comprised of II-VI group compound semiconductor solar cells (for example, CdS/CdTe solar cells).

The resin layer 10 may be made of a fluoropolymer which is a derivative of a compound selected from the group consisting of compounds containing a perfluoroalkylene group and active hydrogen atoms. The compounds containing a perfluoroalkylene group and active hydrogen atoms are marketed under the trade mark "Lumiflon ®" of Asahi Glass Co., Ltd. Several grades of Lumiflons such as LF100C, LF200C, LF300C, LF302C and LF400C are commercially available.

The curing agents for them are melamine or methyl melamine, or compounds containing isocyanate groups which are sold under trade marks such as "Coronate EH ®" and "Coronate 2507 ®" of Japan Polyurethane Industrial Co., Ltd. The "Coronate EH ®" is a trimer of hexamethylenediisocyanate.

The back cover 7 is made of a resin-coated Al film or a laminated layer composed of a Tedlar film, an Al film and a Tedlar film, which are laminated in the order listed. The back cover 7 is provided for protecting the solar cells 1. In some uses of the solar module, the back cover 7 is not always necessary to be provided.

Figure 4:
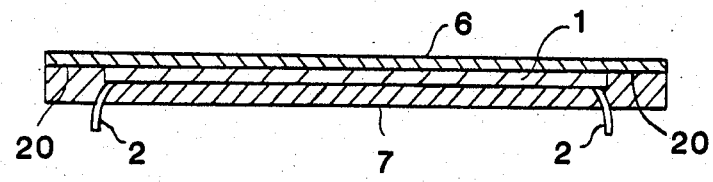
FIG. 4 is a schematic cross-sectional view showing another embodiment of a solar modular according to the present invention.

FIG. 4 shows a construction of a solar module of the invention wherein the back cover is not provided. In the case of the FIG. 4 construction, the thickness of the resin layer 10 may be thicker than that of the FIG. 2 embodiment. Further, the solar module of FIG. 4 cannot be used alone in an outdoor condition, but it may be used with some particular protection against water permeation.

In both of the embodiments of FIGS. 2 and 4, the width of the peripheral margin 20 between the side edge of the solar cell array 1 and the side edge of the glass superstrate 6 is preferably at least 5 mm so that water cannot permeate to the side edge of the solar cell array 1 through the resin layer 10. The at least 5 mm margin 20 at the periphery of the glass superstrate 6 is also useful when the solar module is supported by a certain supporting member which can hold the solar module at the peripheral margin 20.

The spatial loss of the effective area for the solar cell array due to the peripheral margin is not a problem because the area of the peripheral margin is negligibly small compared with the whole area of the surface of the glass superstrate.

Referring again to FIG. 2, the back cover 7 protects against permeation of water from the back surface of the solar cell array 1, so that the thickness of the resin layer, or the adhesive layer 10 may be reduced. To conceive of permeation of water from the side of the solar module through the gap between the glass superstrate 6 and the back cover 7, the distance between the glass superstrate 6 and the back cover 7, or the thickness of the resin layer 10, may be as thin as possible. On the other hand, the thin-film type solar cells and wiring for connecting them are formed by thin-film forming techniques such as vacuum evaporation and screen printing, by which the thickness of the solar cell array can be made very small (usually less than 100 μm). This small thickness can be leveled off by a small amount of resin. Accordingly, the thickness of the resin layer 10 can be made reduced, which is advantageous in reducing the size of the solar module.

Hereinafter, the present invention will be described by reference to the following Examples.

EXAMPLE 1

A CdS/CdTe type photovoltaic cell array was formed on a glass superstrate leaving a margin of 5 mm width along the periphery of the glass superstrate. Then a mixture of 100 parts of LF302C and 20 parts of Coronate EH was coated on the photovoltaic cell array and the peripheral margin of the glass superstrate and cured at 120° C. for 20 minutes, thereby forming the resin layer. Thus, a solar module having a construction as shown in FIG. 4 was obtained. In the same way, other samples were obtained by using various materials for the resin layer. The thus obtained solar module samples were subjected to a temperature of 80° C. and relative humidity of 95% for 1000 hours. Thereafter, the samples were tested for changes in appearance and photovoltaic properties. The test results are shown in Table 1.

TABLE 1

| Sample No. | Coating material | Change in Appearance | Change in Photovoltaic properties (%) |
|---|---|---|---|
| 1 | Lumiflon ® and Coronate ® EH | No change | −3 |
| 2 | Hi-Urethan ® No. 5000 (*1) | No change | −35 |
| 3 | Pelgan ® Z (*2) | No change | −40 |
| 4 | KE-109A and KE-109B (*3) | No change | −30 |
| 5 | NWF-82 (*4) | No change | −21 |
| 6 | XM-1883 and XH-1884 (*5) | No change | −27 |
| 7 | CE-30 and XY-1933 (*5) | No change | −37 |
| 8 | 8300X-4 (*6) | No change | −10 (−6~−13) |
| Sample of Example III | Lumiflon ® and CJ 1000 (*7) | No change | −4 |

(*1) Urethane resin sold by Nippon Oil & Fats Co., Ltd.
(*2) Elastomeric silicone resin sold by Dow Corning Co., Ltd.
(*3) Transparent silicone resin sold by SHIN-ETSU Chemical Industry Co., Ltd.
(*4) Green epoxy resin sold by Izumi Kasei Co., Ltd.
(*5) Transparent epoxy resin sold by Nippon Pelnox Corporation
(*6) Epoxy resin sold by Nitto Electric Industrial Co., Ltd.
(*7) Resol type phenol resin sold by Matsushita Electric Works, Ltd.

As seen from Table 1, the sample in which the mixture of LF302C and Coronate EH was used as the coating material showed only a little change in photovoltaic properties.

Although test results are not shown, the mixtures of the other grades of Lumiflons and the Coronates cured under the other conditions such as 80° C. for 60 minutes, 100° C. for 20 to 80 minutes, and 120° C. for 20 minutes showed similar results.

EXAMPLE 2

A solar module, having the same construction as that of sample No. 1 in Example 1 except that 100 parts of resol type phenol resin was used instead of the 20 parts of Coronate EH, was obtained and tested in the same way as in Example 1. The result is shown in Table 1, which showed a superior performance similarly to Sample No. 1.

EXAMPLE 3

A solar module sample having a construction as shown in FIG. 2 was obtained where a mixture of 100 parts of LF302C and 20 parts of Coronate EH was used as the adhesive layer, and the mixture was cured at 120° C. for 20 minutes. Other samples were obtained by using other materials for the adhesive layer. The thus obtained samples were dipped in boiling (100° C.) water for 36 hours and then in ice (0° C.) water for 36 hours. Thereafter, the samples were tested for changes in appearance and photovoltaic properties. The test results are shown in Table 2.

TABLE 2

| Sample No. | Kind of adhesive | Width of peripheral margin (mm) | Thickness of adhesive layer (mm) | Change in Appearance | Change in Photovoltaic properties (%) |
|---|---|---|---|---|---|
| 1 | Lumiflon ® and Coronate EH | 6.5 | <0.1 | No change | −0 |
| 2 | 8300X-4 | 6.5 | <0.1 | No change | −3 |
| 3 | KE-109A and KE-109B | 6.5 | <0.1 | Side of module was slightly swollen. | −4 |

As seen from Table 2, the sample using the mixture of LF302C and Coronate EH as the adhesive layer showed almost no change in its photovoltaic properties.

The same experiments were carried out by applying other curing conditions such as 80° C. for 60 minutes, 100° C. for 40 minutes, and 120° C. for 20 minutes. But the curing condition was proved not to affect the performance of the solar module.

Further, the solar modules labeled as Sample No. 1 in Examples 1, and 3 and in Example 2 were placed on a roof top for one year for a life test, but no degradation in their photovoltaic properties and no changes in their appearance could be seen.

The above embodiments and Examples are described for better understanding of the present invention, but not for limiting the scope of the invention. Therefore, it should be understood that various changes and modifications are made without departing from the scope of the present invention as defined in the appended claims.

What is claimed is:

1. A solar module comprising:
a glass superstrate;
a solar cell array comprised of a plurality of Group II-IV compound semiconductor solar cells, formed on said glass superstrate while leaving a margin along the periphery of said glass superstrate; and
a resin layer coated on said solar cell array and said peripheral margin of said glass superstrate, wherein said resin layer is made of a fluoropolymer derived from a compound containing a perfluoroalkylene group and active hydrogen atoms.

2. A solar module comprising:
a glass superstrate;
a solar cell array comprised of a plurality of Group II-IV compound semiconductor solar cells, formed on said glass superstrate while leaving a margin along the periphery of said glass superstrate;
a resin layer coated on said solar cell array and said peripheral margin of said glass superstrate, said resin layer being made of a fluoropolymer derived from a compound containing a perfluoroalkylene group and active hydrogen atoms; and
a back cover adhered to said resin layer by the adhesiveness of said resin layer for covering said solar cell array and said peripheral margin of said superstrate.

3. The solar module according to claim 2, wherein said back cover is a resin-coated Al layer.

4. The solar module according to claim 2, wherein said Group II-IV compound semiconductor solar cells are CdS/CdTe solar cells.

* * * * *